United States Patent
Han et al.

(10) Patent No.: US 6,801,186 B2
(45) Date of Patent: Oct. 5, 2004

(54) ANALOG BUFFER AND METHOD OF DRIVING THE SAME

(75) Inventors: Chul Hi Han, deceased, late of Taejun (KR), by Mi Hee Kim, legal representative; Hoon Ju Chung, Taejun (KR)

(73) Assignee: LG.Philips LCD Co., Ltd., Seoul (KR)

( * ) Notice: Subject to any disclaimer, the term of this patent is extended or adjusted under 35 U.S.C. 154(b) by 211 days.

(21) Appl. No.: 10/097,356

(22) Filed: Mar. 15, 2002

(65) Prior Publication Data

US 2003/0030617 A1 Feb. 13, 2003

Related U.S. Application Data

(63) Continuation of application No. 09/892,477, filed on Jun. 28, 2001, now abandoned.

(30) Foreign Application Priority Data

Aug. 11, 2000 (KR) ...................................... P2000-46579

(51) Int. Cl.$^7$ ................................................. G09G 3/36
(52) U.S. Cl. ...................................... 345/103; 345/104
(58) Field of Search ............................ 345/87, 90, 91, 345/92, 95, 103, 104; 330/252, 253, 258, 261, 296, 300

(56) References Cited

U.S. PATENT DOCUMENTS 6,377,121 B1 * 4/2002 Giduturi ...................... 330/253
6,566,957 B1 * 5/2003 Caine .......................... 330/296

* cited by examiner

Primary Examiner—Vijay Shankar
(74) Attorney, Agent, or Firm—McKenna Long & Aldridge LLP

(57) ABSTRACT

An analog buffer, and a driving method thereof, that has a low power consumption in driving a data line of a liquid crystal display and is insensitive to a deviation of device parameters to have a minor error between an input voltage and an output voltage, includes a first transistor and a second transistor connected in such a manner to be driven into a push-pull circuit. A first switch and a third switch connect and disconnect a first reference voltage and a second reference voltage such that the same current flows in the sources of the first and second transistors. A first capacitor charges the voltage between the gate and the source of the first transistor, and a second capacitor charges the voltage between the gate and the source of the second transistor. A second switch switches an application of the input voltage to the input stage of the push-pull circuit, and a fourth switch switches a charge of voltages between the gates and the sources of the first and second transistors in the first and second capacitors.

16 Claims, 12 Drawing Sheets and fabrication technique. In the mean time, the poly-Si TFT
ANALOG BUFFER AND METHOD OF DRIVING THE SAME This application is a continuation of application Ser. No. 09/892,477 filed Jun. 28, 2001, ABANDONED.

REFERENCES TO RELATED APPLICATIONS

This application claims benefit of Korean Patent Application No. P2000-46579, filed on Aug. 11, 2000, the entirety of which is hereby incorporated by reference for all purposes as if fully set forth herein.

BACKGROUND OF THE INVENTION

1. Field of the Invention

This invention relates to a liquid crystal display device, and more particularly to an analog buffer and a driving method thereof that requires low power consumption in driving a data line of the liquid crystal display and is insensitive to a deviation of device parameters to have a minor error between an input voltage and an output voltage.

2. Description of the Related Art

Nowadays, a display device requires an ability to display a larger amount of information in conformity to the development into an intelligent society. In addition to this trend, the display device also needs to have high resolution, small thickness, light weight and low power consumption. Research has been actively conducted to meet these requirements.

Generally, a liquid crystal display (LCD) controls light transmissivities of liquid crystal cells in response to a video signal to thereby display a picture. An active matrix LCD provided with a switching device for each liquid crystal cell is suitable for displaying a moving picture. The active matrix LCD mainly uses a thin film transistor (TFT) as the switching device.

The active matrix LCD displays a picture corresponding to video signals, such as television signals, on a picture element or pixel matrix having pixels arranged at each intersection between gate lines and data lines. Each pixel includes a liquid crystal cell controlling a transmitted light quantity in accordance with a voltage level of a data signal from the data line. A TFT is arranged at each intersection between the gate lines and the data lines to switch a data signal delivered into the liquid crystal cell in response to a scanning signal (i.e., a gate signal) from the gate line.

FIG. 1A and FIG. 1B show structures of an amorphous silicon thin film transistor LCD and a poly-crystalline silicon thin film transistor LCD, respectively.

Referring to FIG. 1A, the amorphous silicon thin film transistor (a-Si TFT) LCD includes a TFT array 3 provided on a substrate 1, a data driver 6 and a gate driver 8 for driving the TFT array 3, and a printed circuit board (PCB) 4 for connecting the TFT array 3 to the data and gate drivers 6 and 8. The a-Si TFT LCD has a low electric field mobility and thus has the drivers 6 and 8 provided at the exterior thereof.

On the other hand, a poly-crystalline silicon thin film transistor (poly-Si TFT) LCD as shown in FIG. 1B includes a TFT array 5 provided on a substrate 2, and a data driver 7 and a gate driver 9 for driving the TFT array 5. In the poly-Si TFT LCD, driving circuits such as the data driver 7 and the gate driver 9 are mounted in the panel to largely reduce the number of signal lines connected to the exterior thereof, so that a product responsibility can be improved to largely reduce a manufacturing cost. Also, a poly-Si TFT having a smaller size than an a-Si TFT is used as a pixel switch owing to a high electric field mobility, to thereby obtain a high aperture ratio easily. Accordingly, research on the poly-Si TFT LCD has been actively conducted.

The poly-Si TFT LCD has a most significant advantage over the a-Si TFT LCD in that it can mount a CMOS circuit onto a cheap large-size glass substrate. Accordingly, with the poly-Si TFT LCD, it is possible to form on the same glass substrate the driving circuits such as the data driver 6 and the gate driver 7, which are provided at the exterior thereof in the case of an a-Si TFT LCD. If the performance of the poly-Si TFT is improved continuously, then the poly-Si TFT LCD can have an increased circuit density and dimension, so that a central processing unit (CPU) and various sensors can be integrated to make a future ideal display device. However, although such an expectation can be realized only on a large-scale screen, the poly-Si TFT LCD has thus far only been applied to a medium/small-scale screen for a viewer of a digital camera or a projector, due to problems in the circuit performance according to device characteristics LCD trends toward a large-scale screen and an improved performance, e.g., a 10.4" XGA low-temperature poly-Si TFT LCD made by Toshiba corp. and a 12.1" XGA low-temperature poly-Si TFT LCD made by LG PHILIPS LCD corp.

If the performance of such a poly-Si TFT is improved to increase an operation speed of the circuit, then it is essential to implement an analog buffer capable of driving the data lines on the panel. Although a typical single-crystalline silicon circuit has used an operational amplifier as the analog buffer, employing an operational amplifier for a poly-Si TFT having a large characteristic variation has a problem in that it has a large offset voltage and a large power consumption caused by a normal current due to its difficult matching characteristic. For this reason, it becomes difficult to use an operational amplifier as the analog buffer for the poly-Si TFT. This requires an analog buffer that is insensitive to a characteristic variation of the poly-Si TFT and has a simple structure to reduce the occupied area and power consumption. To use an analog buffer in which an N-channel poly-Si TFT is connected to a P-channel poly-Si TFT in a push-pull configuration, instead of the operational amplifier, forces an output voltage to generate a direct current voltage error corresponding to a threshold voltage. An analog buffer suggested for the purpose of overcoming such a direct current voltage error is as shown in FIG. 2.

FIG. 2 is a circuit diagram of a conventional analog buffer with a capacitance capable of eliminating a direct current voltage error, and FIG. 3 is a driving waveform diagram for explaining an operation of the analog buffer shown in FIG. 2.

Referring to FIG. 2 and FIG. 3, the analog buffer includes: a first node P1 receiving an externally applied input voltage; first and third switches SW1 and SW3 connected to the first node P1 to control the input voltage Vin; a second node P2 connected to the first switch SW1; a third node P3 connected to the third switch SW3; a capacitor Cvt connected between the second node P2 and the third node P3 to charge a desired voltage; a second switch SW2 for conducting a desired voltage charged in the capacitor Cvt into a buffer; a fourth node P4 connected to the second switch SW2; and an N-channel poly-Si TFT T1 and a P-channel poly-Si TFT T2 connected between the second node P2 and the fourth node P4. In this case, the N-channel poly-Si TFT T1 is connected to the P-channel poly-Si TFT in a push-pull configuration.

The driving operation of such an analog buffer can be divided into three cases, depending on a range of the input voltage applied to the first node P1.

The first case is when the input voltage Vin is larger than the sum of the output voltage Vout and the threshold voltage Vtn of the N-channel poly-Si TFT T1.

First, in an initialization interval of the analog buffer, the first switch SW1 and the second switch SW2 are closed at the same time while the third switch SW3 is open. An input voltage Vin applied to the first node P1 is applied, via the closed first and second switches SW1 and SW2, to gate electrodes of the N-channel poly-Si TFT T1 and the P-channel poly-Si TFT T2 and the capacitor Cvt. By the input voltage Vin applied to the gate electrodes of the N-channel poly-Si TFT T1 and the P-channel poly-Si TFT T2 and the capacitor Cvt, the N-channel poly-Si TFT T1 is turned on while the P-channel poly-Si TFT T2 is not turned on. Upon turning-on the N-channel poly-Si TFT T1, an output voltage Vout, corresponding to the input voltage Vin, reduced by Vtp (the threshold voltage of the N-channel poly-Si TFT T1) is output to the fourth node P4. Also, the threshold voltage Vtn of the N-channel poly-Si TFT T1 is charged in the capacitor Cvt. This is because the capacitor Cvt and the gate electrode and the source electrode of the N-channel poly-Si TFT T1 form a single loop and are connected to each other in parallel.

In an error elimination interval of the analog buffer, the first switch SW1 and the second switch SW2 are opened while the third switch SW3 is closed. At this time, the input voltage Vin is applied, via the third switch SW3, to the third node P3. The input voltage Vin applied to the third node P3 is added to the threshold voltage Vtn charged in the capacitor Cvt during the initialization interval of the analog buffer. This sum voltage (Vin+Vtn) is applied to the gate electrodes of the N-channel poly-Si TFT T1 and the P-channel poly-Si TFT T2. At this time, the P-channel poly-Si TFT T2 maintains a turned-off state. The sum voltage (Vin+Vtn) applied to the gate electrode of the N-channel poly-Si TFT T1 is reduced by the threshold voltage Vtn of the N-channel poly-Si TFT T1 and, thereafter, the input voltage Vin only is output to the fourth node P4 as it is. In other words, an output voltage Vout at the fourth node P4 becomes equal to the input voltage Vin.

The second case is when an input voltage Vin is smaller than the sum of the output voltage Vout and the threshold voltage Vtp of the P-channel poly-Si TFT T2.

In an initialization interval of the analog buffer, the first switch SW1 and the second switch SW2 are closed at the same time while the third switch SW3 is open. An input voltage Vin applied to the first node P1 is applied, via the closed first and second switches SW1 and SW2, to the N-channel poly-Si TFT T1 and the P-channel poly-Si TFT T2 and the capacitor Cvt. By the input voltage Vin applied to the N-channel poly-Si TFT T1, the P-channel poly-Si TFT T2 and the capacitor Cvt, the P-channel poly-Si TFT T2 is turned on while the N-channel poly-Si TFT T1 is not turned on. Upon turning-on of the P-channel poly-Si TFT T2, an output voltage Vout corresponding to the input voltage Vin, reduced by Vtp (the threshold voltage of the P-channel poly-Si TFT T2) is output to the fourth node P4. Also, a threshold voltage Vtp of the P-channel poly-Si TFT T2 is charged in the capacitor Cvt. This is because the capacitor Cvt and the gate electrode and the source electrode of the P-channel poly-Si TFT T2 form a single loop and are connected to each other in parallel.

In an error elimination interval of the analog buffer, the first switch SW1 and the second switch SW2 are opened while the third switch SW3 is closed. At this time, an input voltage Vin is applied, via the third switch SW3, to the third node P3. The input voltage Vin applied to the third node P3 is added to the threshold voltage Vtp charged in the capacitor Cvt during the initialization interval of the analog buffer. This sum voltage (Vin+Vtp) is applied to the gate electrodes of the N-channel poly-Si TFT T1 and the P-channel poly-Si TFT T2. At this time, the N-channel poly-Si TFT T1 maintains a turned-off state. The sum voltage (Vin+Vtp) applied to the gate electrode of the N-channel poly-Si TFT T1 is reduced by the threshold voltage Vtn of the P-channel poly-Si TFT T2 and, thereafter, the input voltage Vin only is output to the fourth node P4 as it is. In other words, an output voltage Vout at the fourth node P4 becomes equal to the input voltage Vin.

The third case is when an output voltage Vout does keep up with an input voltage Vin. This phenomenon is called a cross-over distortion. The cross-over distortion phenomenon of the analog buffer is negligible if an absolute value of the threshold voltage Vth of the N-channel poly-Si TFT T1 and the P-channel poly-Si TFT T2 is less than twice the threshold voltage of the liquid crystal upon driving of the LCD in a dot inversion mode. However, an analog driving circuit configured by utilizing FIG. 2 causes a loss of an electric charge stored in an analog memory in the initialization interval of the analog buffer because an input voltage Vin is stored in a capacitor as the analog memory. This increases an error between the input voltage Vin to the output voltage Vout. In order to solve this problem, a reference voltage Vref should be applied to an input stage to initialize the analog buffer.

FIG. 4 is a circuit diagram showing a configuration of a conventional analog buffer having a capacitor for eliminating a direct current voltage error using a reference voltage, and FIG. 5 is a driving waveform diagram for explaining an operation of the analog buffer shown in FIG. 4.

The analog buffer shown in FIG. 4 has the same driving characteristic as the analog buffer shown in FIG. 2 except that a reference voltage Vref separated from an input voltage Vin is individually applied to the first switch SW1 so as to initialize the analog buffer. In other words, the analog buffer in FIG. 4 employs a scheme in which a driving method in FIG. 2 of storing a difference between the input voltage Vin and the output voltage Vout on the basis of the input voltage Vin in the initialization interval of the analog buffer is modified to store a difference between an input reference voltage Vref and the output voltage Vout on the basis of an external reference voltage Vref. This results in an advantage of reducing an error between the input voltage Vin to the output voltage Vout because a loss of an electric charge in the analog memory does not exist in the initialization interval of the analog buffer in FIG. 4.

However, the conventional analog buffer has a problem in that its elements generate an error between an input voltage input to the analog buffer and an output voltage output via the analog buffer due to a current flowing at the vicinity of a threshold voltage.

SUMMARY OF THE INVENTION

Accordingly, it is an object of the present invention to provide an analog buffer and a driving method thereof that requires low power consumption in driving a data line of the liquid crystal display and is insensitive to a deviation of device parameters to have a minor error between an input voltage and an output voltage.

In order to achieve these and other objects of the invention, an analog buffer according to one aspect of the present invention includes a first transistor and a second transistor connected in such a manner to be driven into a push-pull circuit; a first switch and a third switch for switching a first reference voltage and a second reference voltage such that the same current flows in the sources of the first and second transistors; a first capacitor for charging the same voltage as a voltage between the gate and the source of the first transistor; a second capacitor for charging the same voltage as a voltage between the gate and the source of the second transistor; a second switch for switching an application of the input voltage to the input stage of the push-pull circuit; and a fourth switch for switching a charge of the same voltage as voltages between the gates and the sources of the first and second transistors in the first and second capacitors.

The analog buffer further includes a third transistor and a fourth transistor connected to the drain electrodes of the first transistor and the second transistor, respectively, for a cascade connection with the push-pull circuit; a fifth switch and a sixth switch for switching a third reference voltage and a fourth reference voltage such that the same current flows in the sources of the third and fourth transistors; a third capacitor for charging a voltage being equal to a voltage difference between the third reference voltage and the first reference voltage; and a fourth capacitor for charging a voltage being equal to a voltage difference between the second reference voltage and the fourth reference voltage.

Furthermore, the analog buffer includes a seventh switch connected to a node at which the sources of the first and second transistors are connected between the data lines such that the same current can be rapidly formed at the sources of the first and second transistors.

In the analog buffer, each of the first transistor and the third transistor consists of a N-channel poly-crystalline thin film transistor, and each of the second transistor and the fourth transistor consists of a P-channel poly-crystalline thin film transistor.

In the analog buffer, the first capacitor is connected between the gate and the source of the first transistor, and the second capacitor is connected between the gate and the source of the second transistor. The first switch is connected between a line to which the first reference is inputted and a node to which the first capacitor and the gate of the first transistor are connected, the second switch is connected between an input line to which the input voltage is applied and a node to which one stage of the first and second capacitor is connected, the third switch is connected between a line to which the second reference voltage is inputted and a node to which the second capacitor and the gate of the second transistor are connected; and the fourth switch is connected a node to which the sources of the first and second transistor are connected and a node to which the first capacitor and the second capacitor are connected. The third capacitor is connected between the gate of the first transistor and the gate of the third transistor, and the fourth capacitor is connected between the gate of the second transistor and the gate of the fourth transistor. The fifth switch is connected between a line to which the third reference voltage is inputted and a node to which the third capacitor and the gate of the third transistor are connected, and the sixth switch is connected between a line to which the fourth reference voltage is inputted and a node to which the fourth capacitor and the gate of the fourth transistor are connected.

A method of driving an analog buffer according to another aspect of the present invention includes an analog buffer initialization step of switching a first reference voltage and a second reference voltage such that the same current flows in source terminals and output terminals of a first transistor and a second transistor connected to be driven into a push-pull circuit and storing threshold voltages between the gates and the sources of the first transistor and the second transistors in first and second capacitors, respectively; and an analog buffer driving step of switching the input voltage such that an output voltage of the output terminal is equal to the input voltage and applying a sum voltage of the switched input voltage with the threshold voltages stored in the first and second capacitors to the gate terminals of the first and second transistors.

In the driving method, said analog buffer initialization step further includes switching a third reference voltage and a fourth reference voltage for a biasing of third and fourth transistors by connecting the third and fourth transistors to drain electrodes of the first and second transistors for a cascade connection to the push-pull circuit and charging voltages equal to a difference voltage between the third reference voltage and the first reference voltage and a difference voltage between the second reference voltage and the fourth reference voltage in third and fourth capacitors, respectively; and said analog buffer driving step further includes applying a sum voltage of the voltages stored in the first and third capacitors with the voltages stored in the second and fourth capacitors to the gates of the third and fourth transistors connected in cascade, respectively.

The driving method further includes allowing the same current to be rapidly formed at the sources of the first and second transistors by connecting a switch between nodes to which the sources of the first and second transistors are connected and a load, thereby opening the switch in said analog buffer initialization interval such that the analog buffer is not influenced by said load while closing the switch in said analog buffer driving interval to drive said drive.

In the driving method, each of the first transistor and the third transistor consists of a N-channel poly-crystalline thin film transistor, and each of the second transistor and the fourth transistor consists of a P-channel poly-crystalline thin film transistor.

In the driving method, the first capacitor is connected between the gate and the source of the first transistor, and the second capacitor is connected between the gate and the source of the second transistor. The first switch is connected between a line to which the first reference is inputted and a node to which the first capacitor and the gate of the first transistor are connected, the second switch is connected between an input line to which the input voltage is applied and a node to which one stage of the first and second capacitor is connected, the third switch is connected between a line to which the second reference voltage is inputted and a node to which the second capacitor and the gate of the second transistor are connected; and the fourth switch is connected a node to which the sources of the first and second transistor are connected and a node to which the first capacitor and the second capacitor are connected. The third capacitor is connected between the gate of the first transistor and the gate of the third transistor, and the fourth capacitor is connected between the gate of the second transistor and the gate of the fourth transistor. The fifth switch is connected between a line to which the third reference voltage is inputted and a node to which the third capacitor and the gate of the third transistor are connected, and the sixth switch is connected between a line to which the fourth reference voltage is inputted and a node to which the fourth capacitor and the gate of the fourth transistor are connected.

BRIEF DESCRIPTION OF THE DRAWINGS

These and other objects will be apparent from the following detailed description of the embodiments of the present invention with reference to the accompanying drawings, in which.

DETAILED DESCRIPTION OF THE PREFERRED EMBODIMENT

Figure 1A:
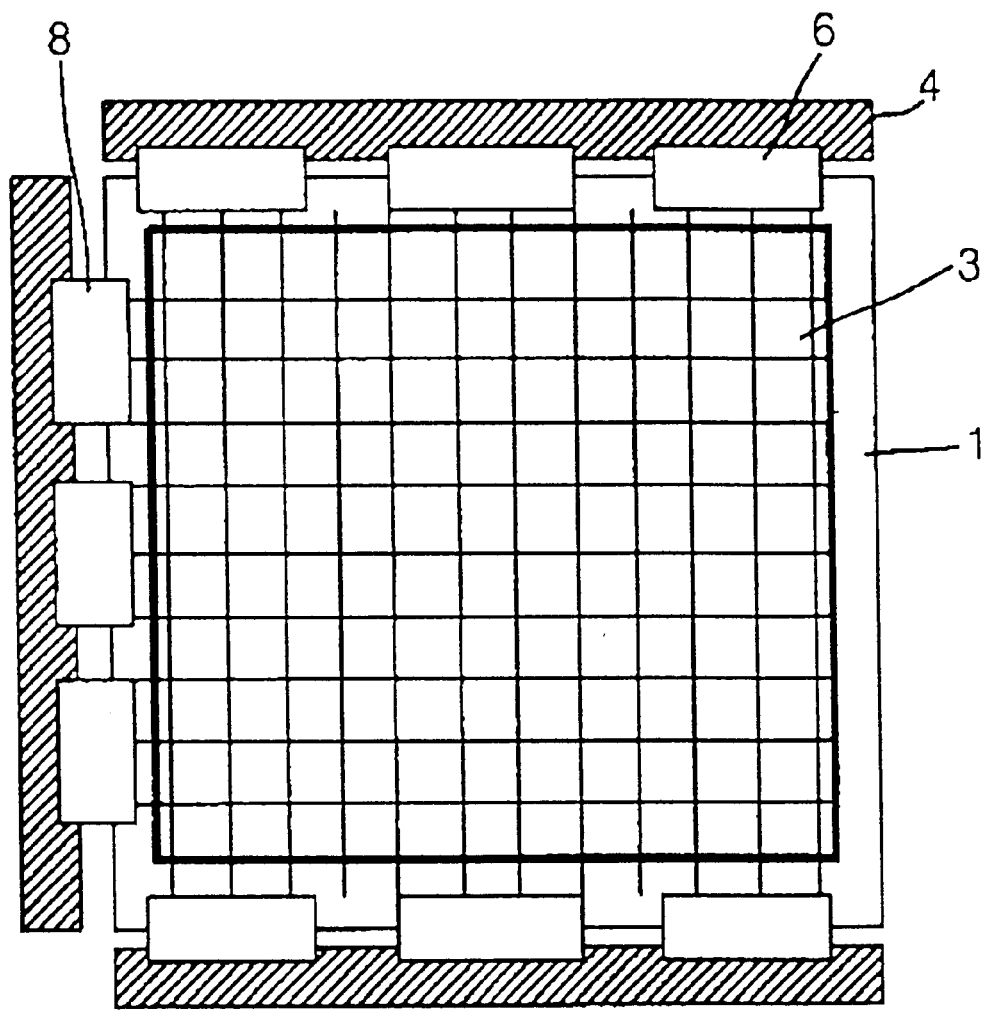
FIG. 1A and FIG. 1B are schematic views showing structures of a conventional amorphous silicon thin film transistor liquid crystal display and a conventional polycrystalline silicon thin film transistor liquid crystal display.
Figure 1B:
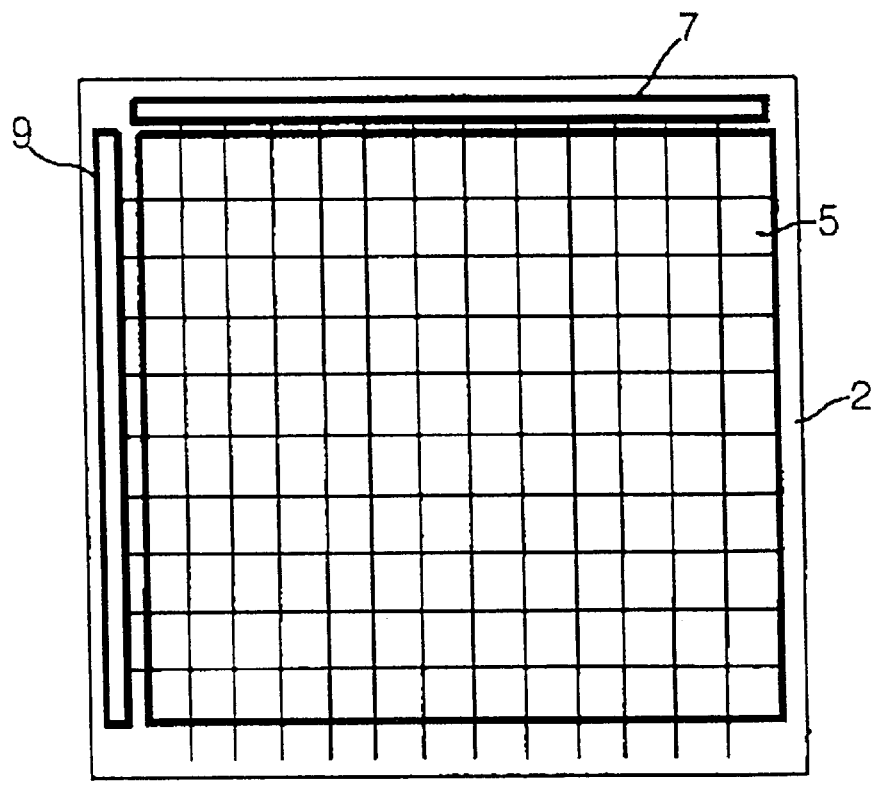
Figure 2:
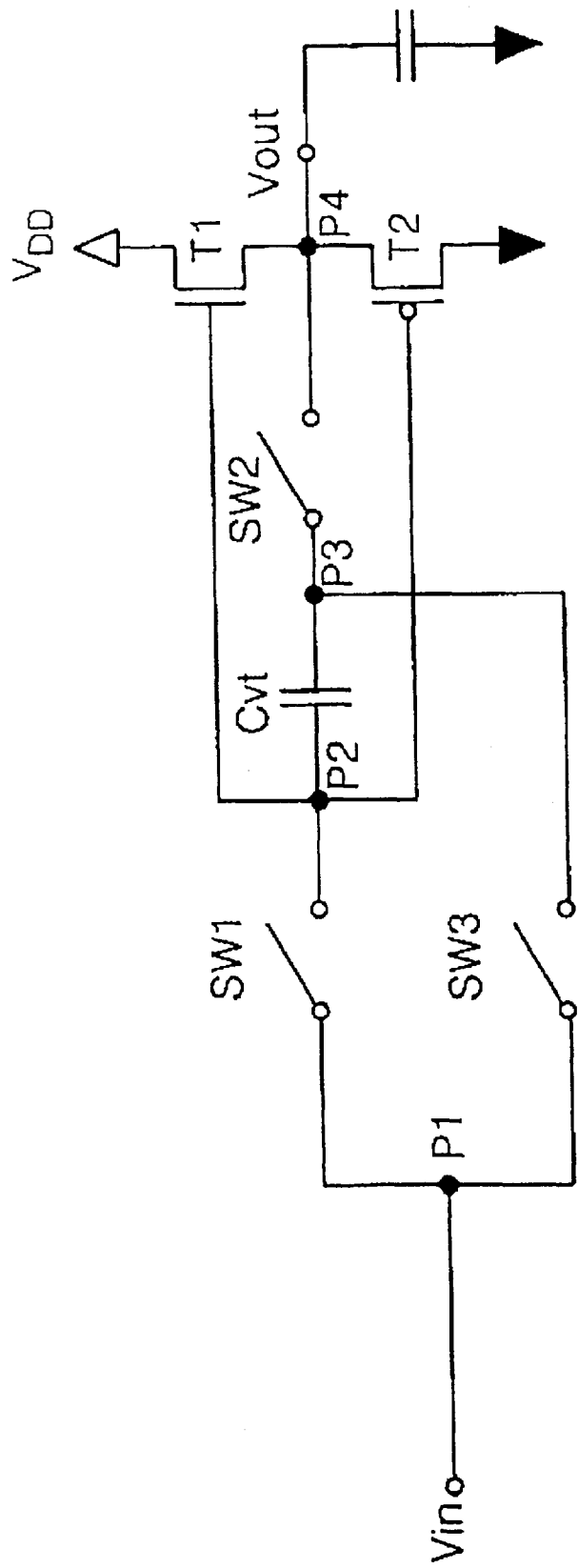
FIG. 2 is a circuit diagram of a conventional analog buffer.
Figure 3:
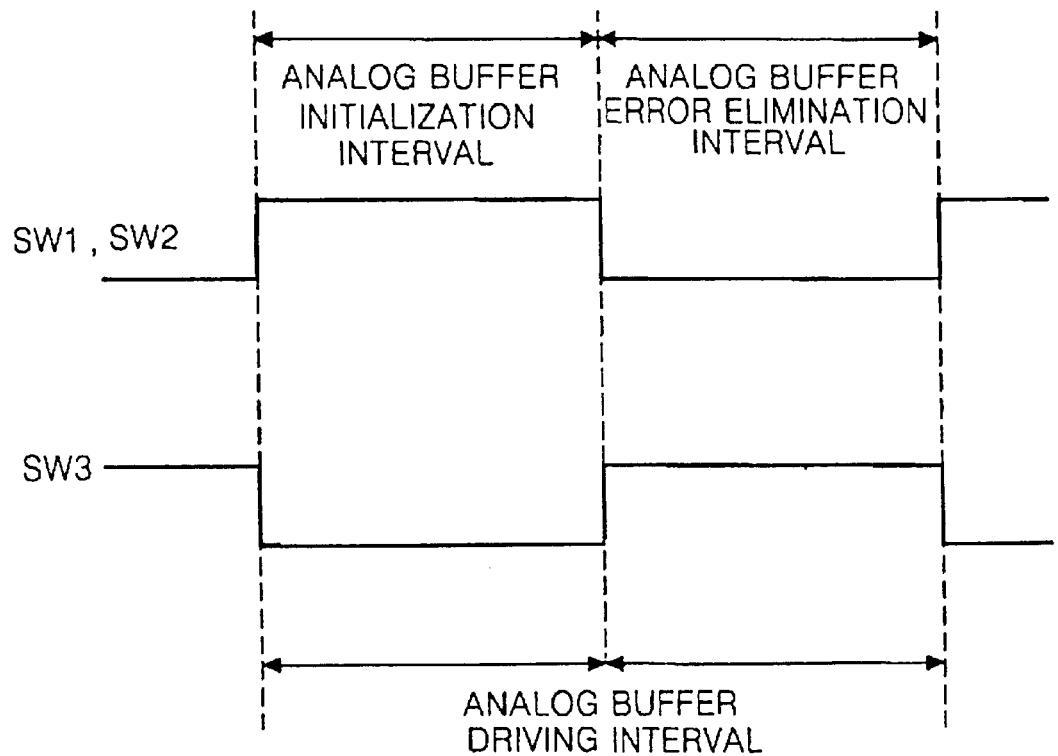
FIG. 3 is a driving waveform diagram for explaining an operation of the analog buffer shown in FIG. 2.
Figure 4:
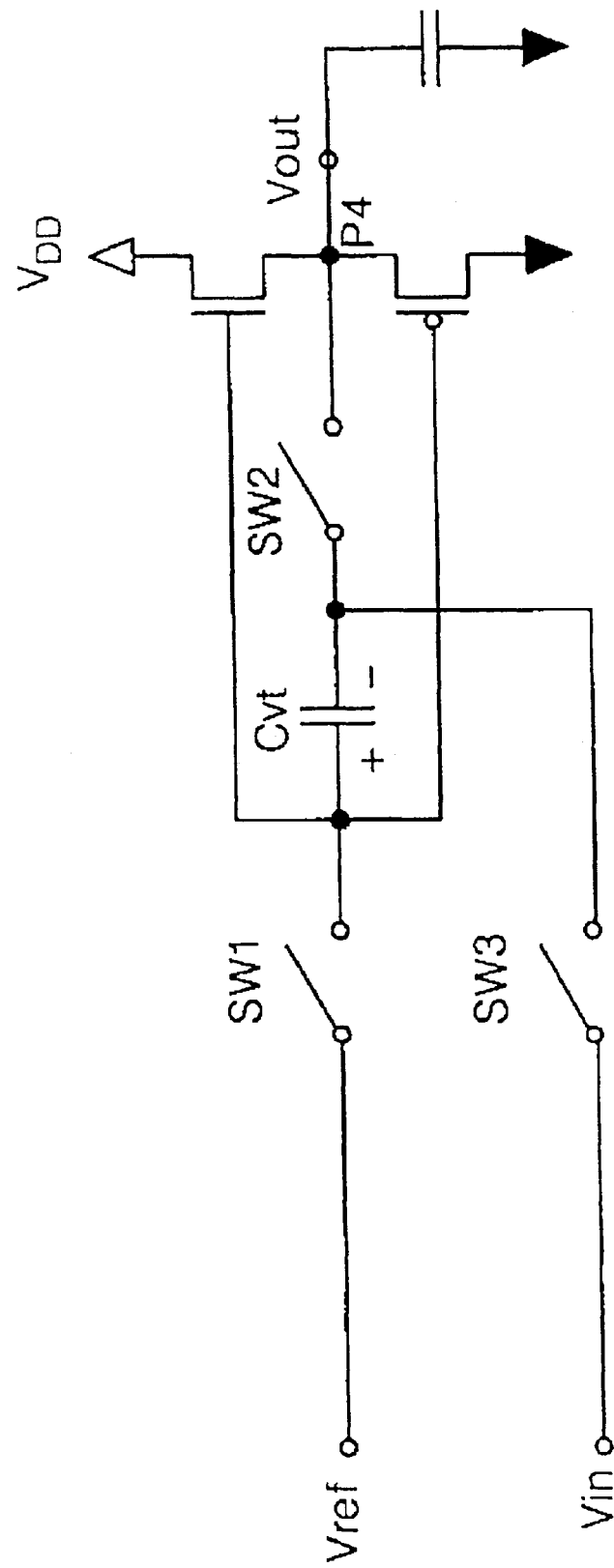
FIG. 4 is a circuit diagram of a conventional analog buffer in which the analog buffer shown in FIG. 2 has been improved.
Figure 5:
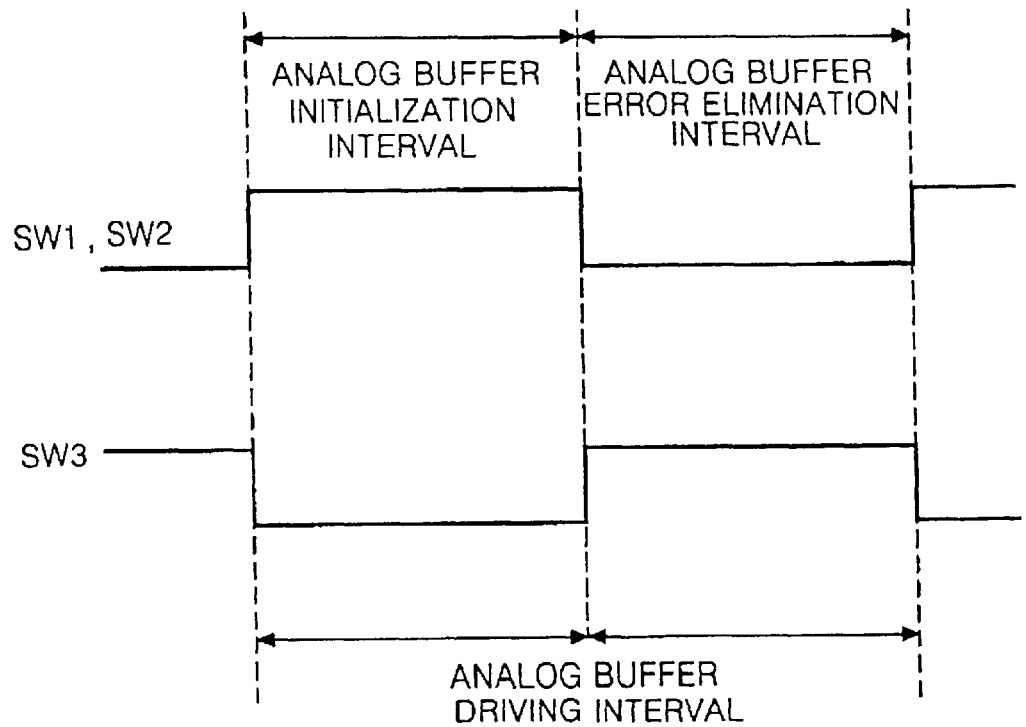
FIG. 5 is a driving waveform diagram for explaining an operation of the analog buffer shown in FIG. 4.
Figure 6:
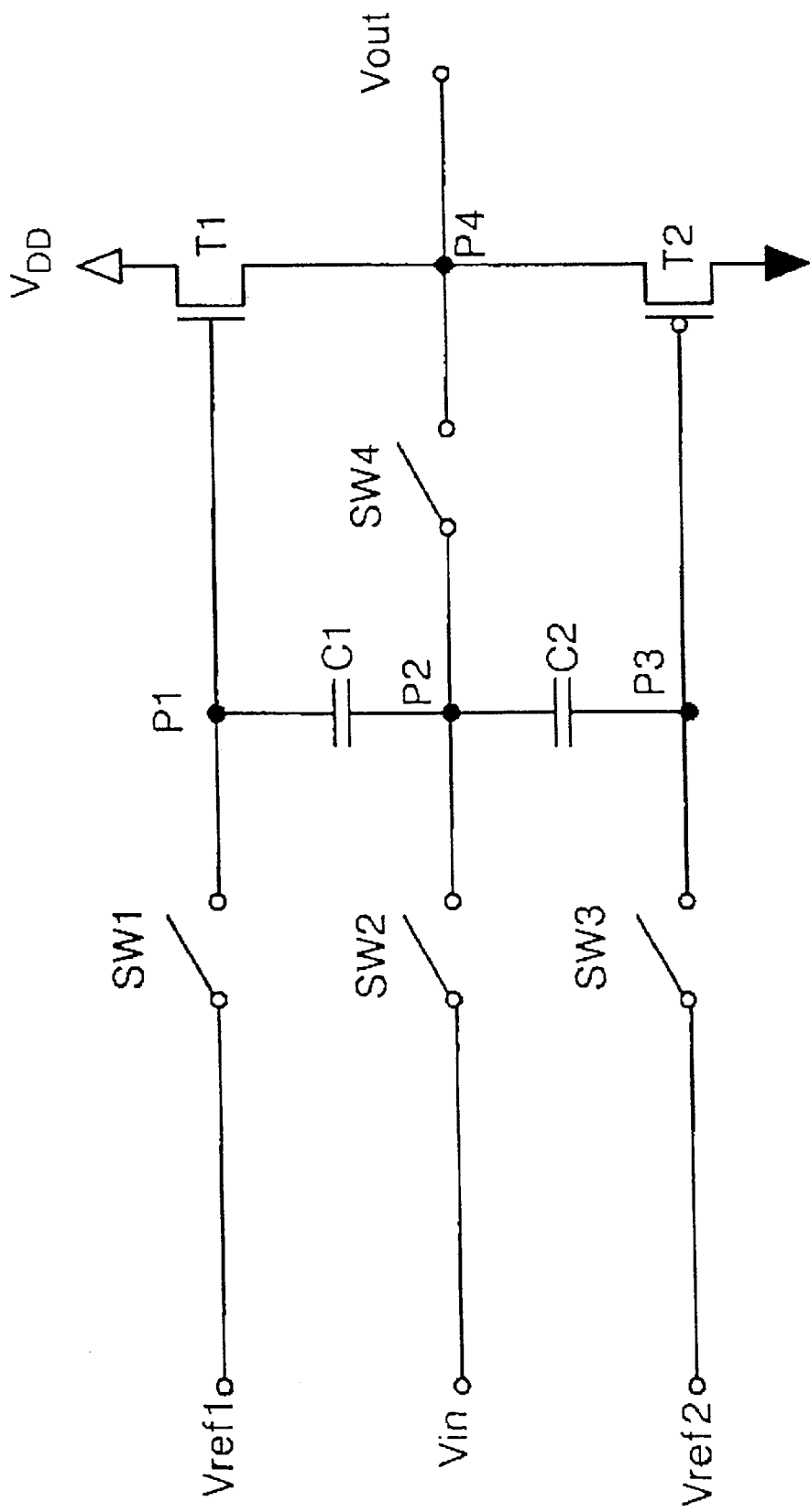
FIG. 6 is a circuit diagram of an analog buffer according to a first embodiment.
Figure 7:
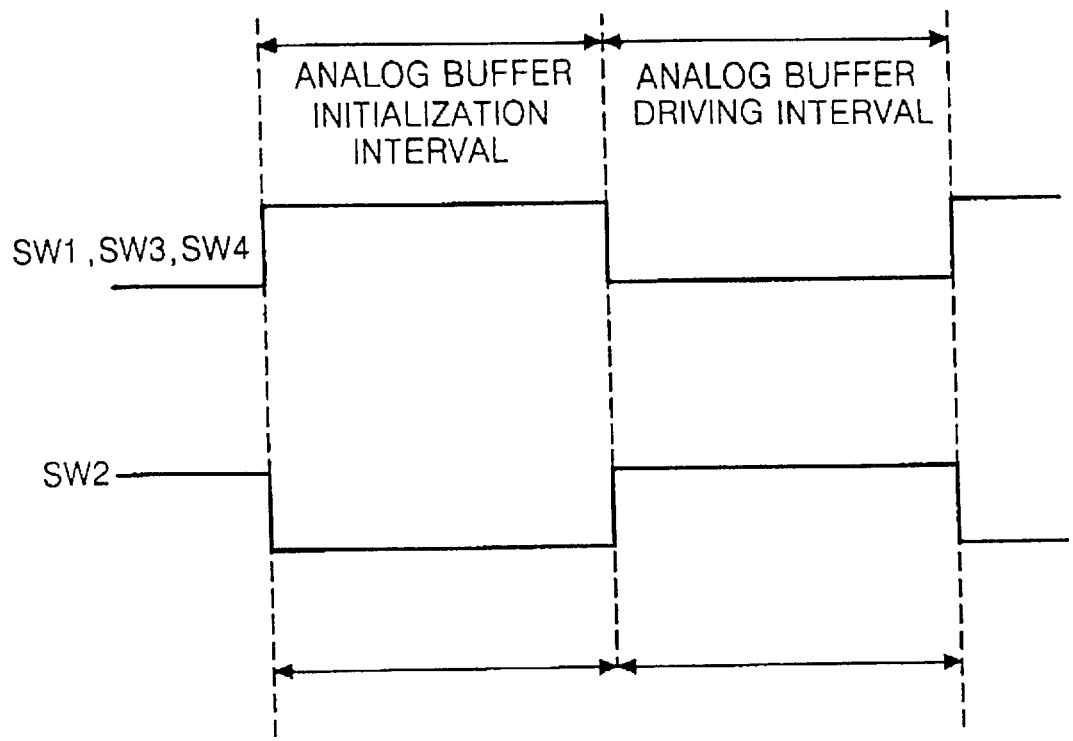
FIG. 7 is a driving waveform diagram for explaining an operation of the analog buffer shown in FIG. 6.

FIG. 6 is a circuit diagram of an analog buffer according to a first embodiment, and FIG. 7 is a driving waveform diagram for explaining an operation of the analog buffer shown in FIG. 6.

Referring to FIG. 6 and FIG. 7, the analog buffer according to the first embodiment includes: a first switch SW1 for controlling a first externally applied reference voltage Vref1; a second switch SW2 for controlling an input voltage Vin, a third switch SW3 for controlling a second externally applied reference voltage Vref2; first, second and third nodes P1, P2 and P3 connected to the first, second and third switches SW1, SW2 and SW3, respectively; a first capacitor C1 connected between the first node P1 and the second node P2; a second capacitor C2 connected between the second node P2; and the third node P3, a fourth switch SW4 connected to the second node P2; a fourth node P4 connected to the fourth switch SW4; an N-channel poly-Si TFT T1 connected between the first node PI and the fourth node P4; and a P-channel poly-Si TFT T2 connected between the third node P3 and the fourth node P4. The N-channel poly-Si TFT T1 is connected to the P-channel poly-Si TFT T2 in a push-pull configuration.

With reference to driving the analog buffer, if the first reference voltage Vref1 and the second reference voltage Vref2 are applied to the N-channel poly-Si TFT T1 and the P-channel poly-Si TFT T2 in the push-pull circuit, respectively, then a source current of the N-channel poly-Si TFT T1 becomes equal to that of the P-channel poly-Si TFT T2. At this time, threshold voltages between the gate and source electrodes of the N-channel poly-Si TFT T1 and the P-channel poly-Si TFT T2 are stored in the first capacitor C1 and the second capacitor C2. Thereafter, a sum voltage (Vin+Vtn+Vtp), in which the threshold voltages, stored in the first capacitor C1 and the second capacitor C2 are added to the input voltage Vin, is applied to the gate electrodes of the N-channel poly-Si TFT T1 and the P-channel poly-Si TFT T2 to be divided into two operation ranges as shown in FIG. 7 for driving an output stage, thereby driving the analog buffer.

First, in an initialization interval of the analog buffer, the first, third and fourth switches SW1, SW3 and SW4 are closed while the second switch SW2 is opened. Thus, the first and second reference voltages Vref1 and Vref2 are applied to the gate electrodes of the N-channel poly-Si TFT T1 and the P-channel poly-Si TFT T2 respectively, in the push-pull circuit, and an output voltage Vout of the output stage is determined such that a source current of the N-channel poly-Si TFT T1 becomes equal to that of the P-channel poly-Si TFT T2. The threshold voltages Vtn and Vtp between the gate and source electrodes of the N-channel poly-Si TFT T1 and the P-channel poly-Si TFT T2 allowing the source current of the N-channel poly-Si TFT T1 to be equal to that of the P-channel poly-Si TFT T2 are stored in the capacitor C1 and the capacitor C2, respectively.

Then, in a driving interval of the analog buffer, the first, third and fourth switches SW1, SW3 and SW4 are opened while the second switch SW2 is closed. Thus, the input voltage Vin is applied between the first capacitor C1 and the second capacitor C2 and a sum voltage (Vin+Vtn+Vtp) in which the voltages Vtn and Vtp stored in the first capacitor C1 and the second capacitor C2 are added to the input voltage Vin is applied to the gate electrodes of the N-channel poly-Si TFT T1 and the P-channel poly-Si TFT T2, respectively, so that an output voltage Vout of the output stage is determined such that a source current of the N-channel poly-Si TFT T1 is equal to that of the P-channel poly-Si TFT T2. Further, this output voltage Vout keeps up with the input voltage Vin automatically to operate the analog buffer.

Figure 8:
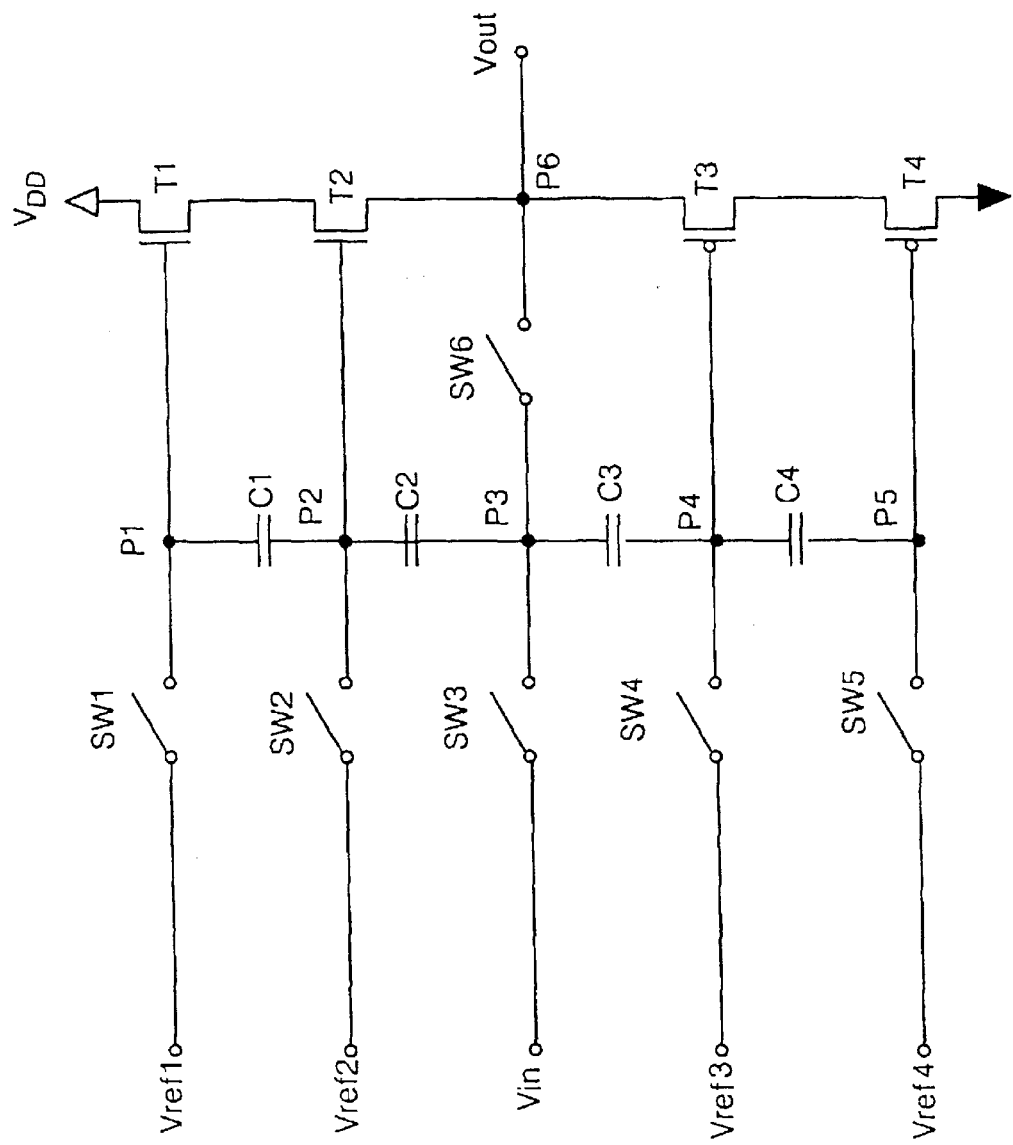
FIG. 8 is a circuit diagram of an analog buffer according to a second embodiment.
Figure 9:
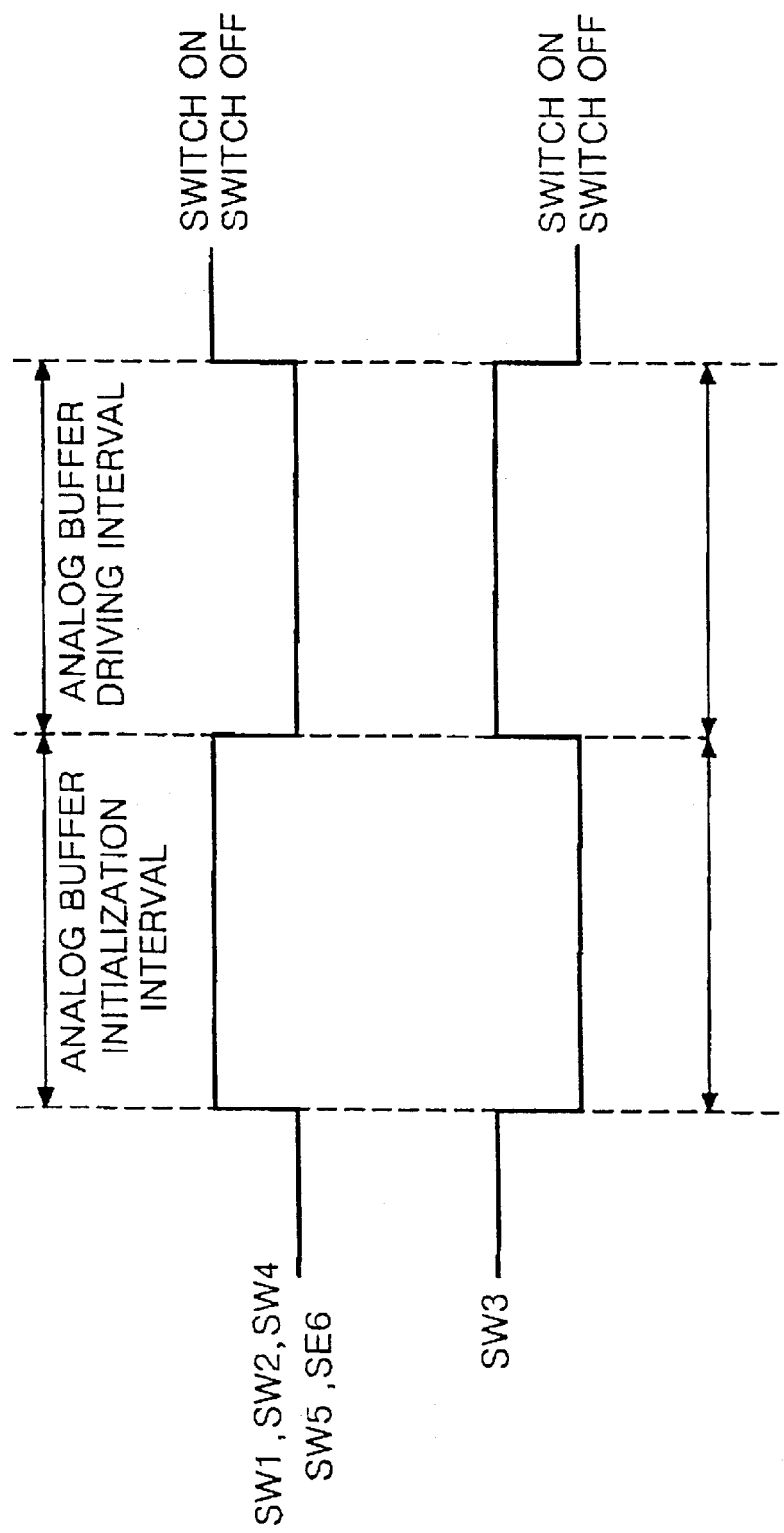
FIG. 9 is a driving waveform diagram for explaining an operation of the analog buffer shown in FIG. 8.

FIG. 8 is a circuit diagram of an analog buffer according to a second embodiment, and FIG. 9 is a driving waveform diagram for explaining an operation of the analog buffer shown in FIG. 8.

Referring to FIG. 8 and FIG. 9, the analog buffer according to the second embodiment includes: a first switch SW1 for controlling a first externally applied reference voltage Vref1; a second switch SW2 for controlling a second externally applied reference voltage Vref2; a third switch SW3 for controlling an input voltage Vin; a fourth switch for controlling a third externally applied reference voltage Vref3; a fifth switch SW5 for controlling a fourth externally applied reference voltage Vref4; first to fifth nodes P1 to P5 connected to the first to fifth switches SW1 to SW5, respectively; a first capacitor C1 connected between the first node P1 and the second node P2; a second capacitor C2 connected between the second node P2 and the third node P3; a third capacitor C3 connected between the third node P3 and the fourth node P4; a fourth capacitor C4 connected between the fourth node P4 and the fifth node P5; a sixth switch SW6 connected between the third node P3 and a sixth node P6; a first N-channel poly-Si TFT T1 and a second N-channel poly-Si TFT T2 connected between the first and second nodes P1 and P2 and the sixth node P6, respectively; and a third P-channel poly-Si TFT T3 and a fourth P-channel poly-Si TFT T4 connected between the fourth and fifth nodes P4 and P5 and the sixth node P6, respectively.

The first N-channel poly-Si TFT T1 and the fourth P-channel poly-Si TFT T4 are connected, in cascade, to drains of the second N-channel poly-Si TFT T2 and the third P-channel poly-Si TFT T3 connected in a push-pull configuration. The first capacitor C1 and the fourth capacitor C4 are connected between the gates of the second N-channel poly-Si TFT T2 and the third P-channel poly-Si TFT T3, connected in a push-pull configuration, and the gates of the first N-channel poly-Si TFT T1 and the fourth P-channel poly-Si TFT T4 connected in cascade, respectively, so as to bias the first N-channel poly-Si TFT T1 and the fourth P-channel poly-Si TFT T4 connected in cascade. Values of the first reference voltage Vref1 and the fourth reference voltage Vref4 are set such that the first N-channel poly-Si TFT T1 and the fourth P-channel poly-Si TFT T4 connected in cascade are operated at saturation areas.

The analog buffer configured as described above is divided into two operation ranges for its driving, as shown in FIG. 9.

First, in an initialization interval of the analog buffer, the first, second, fourth, fifth and sixth switches SW1, SW2, SW4, SW5 and SW6 are closed while the third switch SW3 is opened. Thus, the first, second, third and fourth reference voltages Vref1, Vref2, Vref3 and Vref4 are applied to the gates of the first N-channel poly-Si TFT T1, the second N-channel poly-Si TFT T2, the first P-channel poly-Si TFT T2 and the second P-channel poly-Si TFT T4. At this time, the applied first, second, third and fourth reference voltages Vref1, Vref2, Vref3 and Vref4 set a voltage at the sixth node P6. A source voltage of the first N-channel poly-Si TFT T1 and a source voltage of the second P-channel poly-Si TFT T4 are determined such that source currents of the first N-channel poly-Si TFT T1, the second N-channel poly-Si TFT T2, the third P-channel poly-Si TFT T3 and the fourth P-channel poly-Si TFT T4 become equal to each other. The source voltage of the first N-channel poly-Si TFT T1 is a voltage given by subtracting a threshold voltage Vt1 of the first N-channel poly-Si TFT T1 from the first reference voltage Vref1, and the source voltage of the fourth P-channel poly-Si TFT T4 is a voltage given by subtracting a threshold voltage Vt4 of the fourth P-channel poly-Si TFT T4 from the fourth reference voltage Vref4. At this time, voltages between the gates and the sources of the second N-channel poly-Si TFT T2 and the third P-channel polySi TFT T3, connected in a push-pull configuration, are stored in the second capacitor C2 and the third capacitor C3, respectively. Further, a voltage difference between the first reference voltage Vref1 and the second reference voltage Vref2 is stored in the first capacitor C1, and a voltage difference between the third reference voltage Vref3 and the fourth reference voltage Vref4 is stored in the fourth capacitor C4.

Then, in a driving interval of the analog buffer, the first, second, fourth, fifth and sixth switches SW1, SW2, SW4, SW5 and SW6 are opened while the third switch SW3 is closed. This allows an input voltage Vin to be loaded between the second capacitor C2 and the third capacitor C3, to thereby apply a voltage given by adding the voltages stored in the first, second, third and fourth capacitors C1, C2, C3 and C4 to the input voltage Vin to the gates of the first N-channel poly-Si TFT T1, the second N-channel poly-Si TFT T2, the third P-channel poly-Si TFT T3 and the fourth P-channel poly-Si TFT T4. If a voltage is applied to the gates of the first N-channel poly-Si TFT T1, the second N-channel poly-Si TFT T2, the third P-channel poly-Si TFT T3 and the fourth P-channel poly-Si TFT T4, then a voltage at each node is determined such that source currents of the first N-channel poly-Si TFT T1, the second N-channel poly-Si TFT T2, the third P-channel poly-Si TFT T3 and the fourth P-channel poly-Si TFT T4 becomes equal to each other. Accordingly, an output voltage Vout become equal to the input voltage Vin.

A voltage variation between the drains and the sources of the second N-channel poly-Si TFT T2 and the third P-channel poly-Si TFT T3 can be considerably reduced by the first channel poly-Si TFT T1 and the fourth P-channel poly-Si TFT T4 connected in cascade in the initialization interval and the driving interval of the analog buffer. Accordingly, it becomes possible to considerably reduce an output error of the analog buffer caused by a voltage variation between the drain and the gate of the poly-Si TFT.

Figure 10:
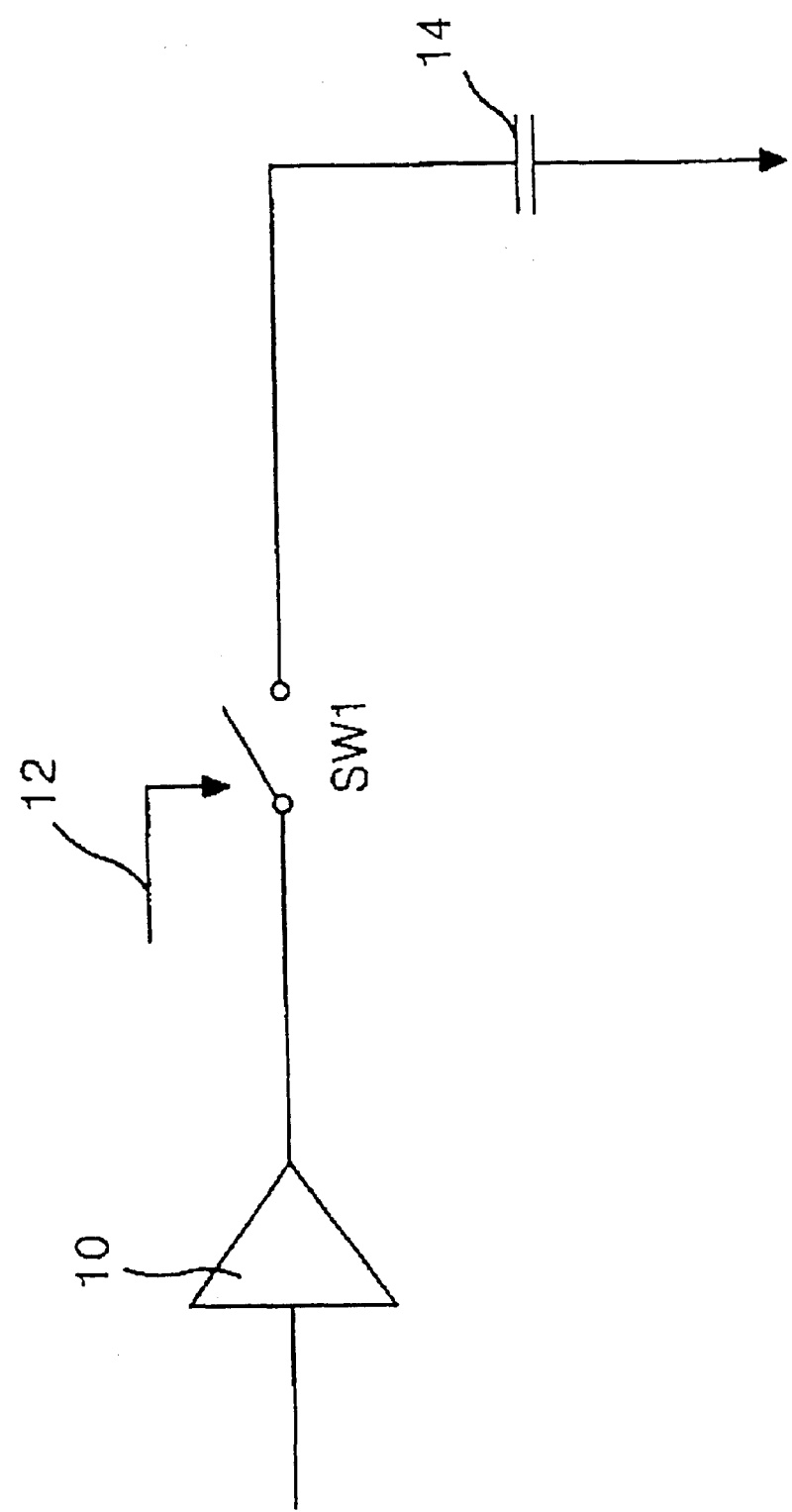
FIG. 10 is a circuit diagram of an analog buffer according to a third embodiment.
Figure 11:
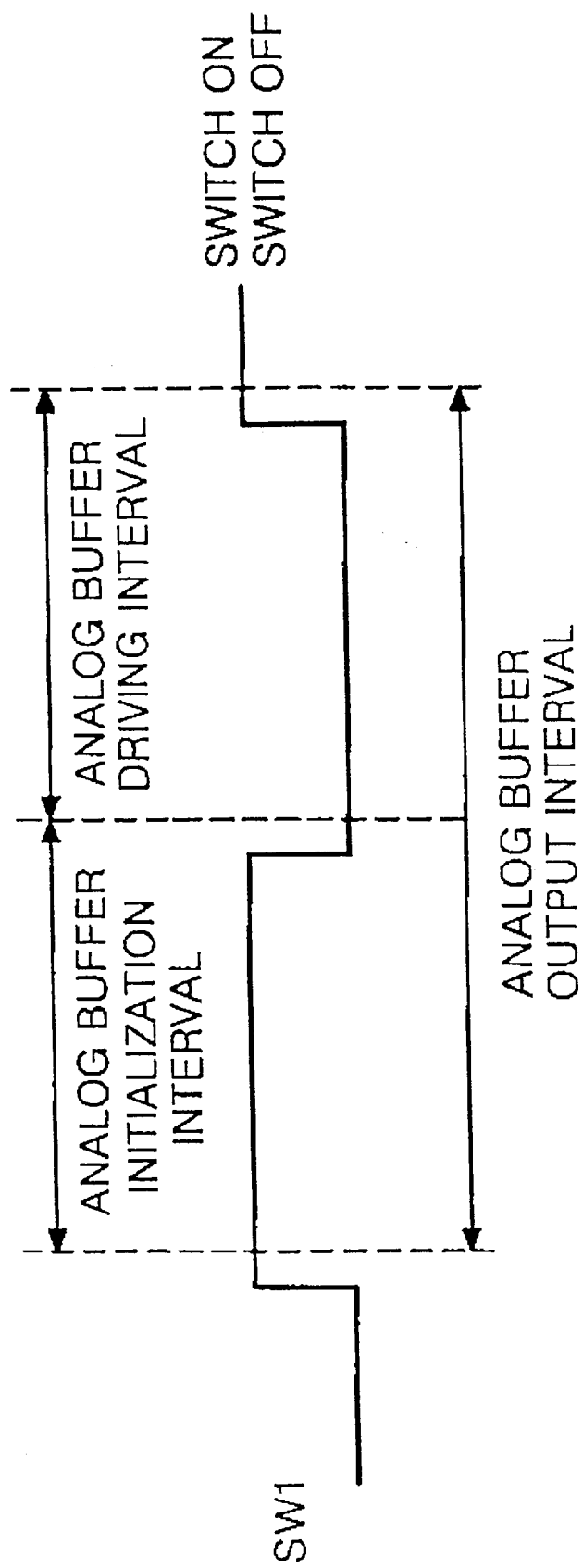
FIG. 11 is a driving waveform diagram for explaining an operation of the analog buffer shown in FIG. 10.

When a large load capacitance is applied onto the analog buffer according to the first or second embodiment, a long time is required to equalize the source currents of the poly-Si TFTs in the initialization interval of the analog buffer, thereby decreasing the speed of the analog buffer. In order to solve this problem, the first switch SW1 is connected to the output stage of the present analog buffer as shown in FIG. 10. FIG. 10 will be described in conjunction with FIG. 11 below.

If it is intended to equalize the source currents of the poly-Si TFTs in the initialization interval of the analog buffer, then a large external load capacitance 14 opens the first switch SW1, using a switching control signal 12. If the first switch SW1 is opened, then the source currents of the poly-Si TFTs become equal to each other within a short time, so that a speed of the analog buffer 10 can be increased.

As described above, according to the present invention, it becomes possible to have low power consumption in driving a data line of the liquid crystal display as well as to be insensitive to a deviation of device parameters to have a minor error between an input voltage and an output voltage.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An analog buffer for delivering an input voltage transmitted from a driving circuit to a data line so as to display a picture, comprising:
   a first transistor and a second transistor connected in a push-pull circuit;
   a first switch and a third switch for switching a first reference voltage and a second reference voltage, respectively, such that a same current flows in sources of the first and second transistors;
   a first capacitor for charging a voltage between a gate and the source of the first transistor;
   a second capacitor for charging a voltage between a gate and the source of the second transistor;
   a second switch for switching an application of the input voltage to an input stage of the push-pull circuit; and
   a fourth switch for switching a charge of the voltages between the gates and the sources of the first and second transistors stored in the first and second capacitors.

2. The analog buffer according to claim 1, further comprising:
   a third transistor and a fourth transistor connected to the drain electrodes of the first transistor and the second transistor, respectively, for a cascade connection with the push-pull circuit;
   a fifth switch and a sixth switch for switching a third reference voltage and a fourth reference voltage such that a same current flows in a sources of the third and fourth transistors;

a third capacitor for charging a voltage difference between the third reference voltage and the first reference voltage; and a fourth capacitor for charging a voltage difference between the second reference voltage and the fourth reference voltage.

3. The analog buffer according to claim 1, further comprising:

a seventh switch connected to a node at which the sources of the first and second transistors are connected between the data lines such that a same current can be rapidly formed at the sources of the first and second transistors.

4. The analog buffer according to claim 2, wherein the first transistor and the third transistor each consists of an N-channel poly-crystalline thin film transistor, and the second transistor and the fourth transistor each consists of a P-channel poly-crystalline thin film transistor.

5. The analog buffer according to claim 1, wherein the first capacitor is connected between the gate and the source of the first transistor, and the second capacitor is connected between the gate and the source of the second transistor.

6. The analog buffer according to claim 1, wherein the first switch is connected between a line to which the first reference voltage is input and a node to which the first capacitor and the gate of the first transistor are connected, the second switch is connected between an input line to which the input voltage is applied and a node to which one stage of the first and second capacitor is connected, the third switch is connected between a line to which the second reference voltage is input and a node to which the second capacitor and the gate of the second transistor are connected; and the fourth switch is connected between a node to which the sources of the first and second transistor are connected and a node to which the first capacitor and the second capacitor are connected.

7. The analog buffer according to claim 2, wherein the third capacitor is connected between the gate of the first transistor and a gate of the third transistor, and the fourth capacitor is connected between a gate of the second transistor and a gate of the fourth transistor.

8. The analog buffer according to claim 2, wherein the fifth switch is connected between a line to which the third reference voltage is input and a node to which the third capacitor and a gate of the third transistor are connected, and the sixth switch is connected between a line to which the fourth reference voltage is input and a node to which the fourth capacitor and a gate of the fourth transistor are connected.

9. A method of driving an analog buffer for delivering an input voltage transmitted from a driving circuit to a data line so as to display a picture, comprising:

(a) switching a first reference voltage and a second reference voltage such that a same current flows in sources and output terminals of a first transistor and a second transistor connected in a push-pull circuit, and storing threshold voltages between gates and the sources of the first transistor and the second transistors in first and second capacitors, respectively; and (b) switching the input voltage such that an output voltage of an output terminal is equal to the input voltage, and applying to gate terminals of the first and second transistors a sum voltage of the switched input voltage and the threshold voltages stored in the first and second capacitors, respectively.

10. The method according to claim 9, wherein further including:

switching a third reference voltage and a fourth reference voltage for biasing third and fourth transistors by connecting the third and fourth transistors to drain electrodes of the first and second transistors in a cascade connection to the push-pull circuit, and charging voltages equal to a difference voltage between the third reference voltage and the first reference voltage, and a difference voltage between the second reference voltage and the fourth reference voltage, in third and fourth capacitors, respectively; and applying to the gates of the third and fourth transistors connected in cascade, respectively a sum voltage of the voltages stored in the first and third capacitors and the voltages stored in the second and fourth capacitors.

11. The method according to claim 9 or 10, further comprising the step of:

allowing the same current to be rapidly formed at the sources of the first and second transistors by connecting a switch between nodes to which the sources of the first and second transistors are connected and a load, opening the switch during, step (a) such that the analog, buffer is not influenced by said load, and closing the switch during step (b) to drive said data line.

12. The method according to claim 10, wherein the first transistor and the third transistor each consists of an N-channel poly-crystalline thin film transistor, and the second transistor and the fourth transistor each consists of a P-channel poly-crystalline thin film transistor.

13. The method according to claim 9, wherein the first capacitor is connected between the gate and the source of the first transistor, and the second capacitor is connected between the gate and the source of the second transistor.

14. The method according to claim 9, wherein the first switch is connected between a line to which the first reference voltage is input and a node to which the first capacitor and the gate of the first transistor are connected, the second switch is connected between an input line to which the input voltage is applied and a node to which one stage of the first and second capacitor is connected, the third switch is connected between a line to which the second reference voltage is input and a node to which the second capacitor and the gate of the second transistor are connected; and the fourth switch is connected between a node to which the sources of the first and second transistor are connected and a node to which the first capacitor and the second capacitor are connected.

15. The method according to claim 10, wherein the third capacitor is connected between the gate of the first transistor and a gate of the third transistor, and the fourth capacitor is connected between the gate of the second transistor and a gate of the fourth transistor.

16. The method according to claim 10, wherein the fifth switch is connected between a line to which the third reference voltage is input and a node to which the third capacitor and a gate of the third transistor are connected, and the sixth switch is connected between a line to which the fourth reference voltage is input and a node to which the fourth capacitor and a gate of the fourth transistor are connected.

* * * * *